United States Patent
Park et al.

(10) Patent No.: US 9,712,123 B2
(45) Date of Patent: Jul. 18, 2017

(54) RECONFIGURABLE POWER AMPLIFIER CAPABLE OF SELECTING WIDE BAND FREQUENCY AND METHOD FOR SELECTING WIDE BAND FREQUENCY

(71) Applicant: ELECTRONICS AND TELECOMMUNICATIONS RESEARCH INSTITUTE, Daejeon (KR)

(72) Inventors: Min Park, Daejeon (KR); Baek-Hyun Kim, Suwon (KR); Cheon-Soo Kim, Daejeon (KR); Song-Cheol Hong, Daejeon (KR); Dong-Woo Kang, Daejeon (KR); Jang-Hong Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/003,669

(22) Filed: Jan. 21, 2016

(65) Prior Publication Data

US 2016/0233838 A1  Aug. 11, 2016

(30) Foreign Application Priority Data

Feb. 5, 2015 (KR) .......................... 10-2015-0018208

(51) Int. Cl.
*H03F 3/45* (2006.01)
*H03F 1/42* (2006.01)
(Continued)

(52) U.S. Cl.
CPC ............. *H03F 1/42* (2013.01); *H03F 1/0277* (2013.01); *H03F 1/56* (2013.01); *H03F 3/193* (2013.01);
(Continued)

(58) Field of Classification Search
CPC ......................................................... H03F 3/45
(Continued)

(56) References Cited

U.S. PATENT DOCUMENTS 5,821,810 A * 10/1998 Swart ........................ H03G 7/00
330/254
6,759,904 B2 * 7/2004 Behzad ............... H01F 17/0006
257/E27.046

(Continued)

FOREIGN PATENT DOCUMENTS

KR    10-2012-0138647 A    12/2012
KR    10-2013-0055843 A    5/2013

OTHER PUBLICATIONS

Joonhoi Hur, et al., "A Multi-Level and Multi-Band Class-D CMOS Power Amplifier for the Linc System in the Cognitive Radio Application", IEEE Microwave and Wireless Components Letters, Jun. 2010, pp. 352-354, vol. 20, No. 6, IEEE.
Unha Kim, et al., "A Multi-Band Reconfigurable Power Amplifier for UMTS Handset Applications", 2010 IEEE Radio Frequency Integrated Circuits Symposium, 2010, pp. 175-178, IEEE.

*Primary Examiner* — Henry Choe

(57) ABSTRACT

Provided is a power amplifier installed in wireless communication terminals and systems. According to one aspect of the present invention, a reconfigurable power amplifier capable of selecting a wide band frequency is provided. The reconfigurable power amplifier includes input transistors receiving a radio frequency (RF) signal and a reconfigurable adaptive power cell configured to select the wide band frequency by applying a common-gate bias voltage to a plurality of common-gate transistors with a plurality of separate common gates to amplify the RF signal.

14 Claims, 8 Drawing Sheets

(51) Int. Cl.
*H03F 1/56* (2006.01)
*H03F 3/193* (2006.01)
*H03F 1/02* (2006.01)
*H03F 3/24* (2006.01)
*H03F 3/72* (2006.01)

(52) U.S. Cl.
CPC ......... *H03F 3/245* (2013.01); *H03F 3/45188* (2013.01); *H03F 3/72* (2013.01); *H03F 2200/111* (2013.01); *H03F 2200/451* (2013.01); *H03F 2200/555* (2013.01); *H03F 2203/45056* (2013.01); *H03F 2203/7209* (2013.01)

(58) Field of Classification Search
USPC .................................................. 330/253, 261
See application file for complete search history.

(56) References Cited

U.S. PATENT DOCUMENTS

| | | | |
|---|---|---|---|
| 7,653,372 B2 * | 1/2010 | Yang | H03D 7/1433 330/252 |
| 8,138,839 B2 * | 3/2012 | Gupta | H03F 1/52 330/258 |
| 8,565,813 B2 | 10/2013 | Kim | |
| 8,588,343 B2 | 11/2013 | Moon et al. | |
| 8,718,582 B2 | 5/2014 | See et al. | |
| 8,749,307 B2 | 6/2014 | Zhu et al. | |
| 2003/0020544 A1 * | 1/2003 | Behzad | H01F 17/0006 330/254 |
| 2013/0127528 A1 | 5/2013 | Choi et al. | |

\* cited by examiner

RECONFIGURABLE POWER AMPLIFIER CAPABLE OF SELECTING WIDE BAND FREQUENCY AND METHOD FOR SELECTING WIDE BAND FREQUENCY

CROSS-REFERENCE TO RELATED APPLICATION

This application claims priority to and the benefit of Korean Patent Application No. 10-2015-0018208, filed on Feb. 5, 2015, the disclosure of which is incorporated herein by reference in its entirety.

ACKNOWLEDGMENT

This work was supported by the Korea Government (MEST) under National Research Foundation of Korea (NRF) Grant 2014R1A2A1A01004954.

BACKGROUND

1. Field of the Invention

The present invention relates to a power amplifier installed in wireless communication terminals and systems, and more particularly, to a power amplifier to which a mode capable of selecting a wide band frequency is applied.

2. Discussion of Related Art

Standards on wireless LAN services began to be discussed ten years ago as demands for various multimedia services in a near field wireless environment have continuously increased, and a market of wireless LAN products supporting up to 600 Mbps based on IEEE 802.11n platform is becoming increasingly active. However, a transmission speed Gbps or more is required to transmit an image of ultrahigh image quality without compression, and because performance of 802.11n cannot satisfy this, IEEE formed a IEEE 802.11ac group and conducted a standardization activity in November, 2008 in order to develop a standard on VHT wireless transmission technology, which is a next generation wireless transmission method. IEEE 802.11ac is a standard of next generation wireless LAN focused on simultaneous connection of multiple users and high performance support that surpasses that of Gbps grade and may provide services for blue ray and uncompressed ultrahigh image quality video in real time. Recently, demands for a smart phone which employs WiFi is explosively increasing, and IEEE 802.11ac is becoming a core technology for a next generation smart phone. Meanwhile, recently wide area wireless LAN employing a frequency band under 1 GHz has been on the rise, and, for example, there are IEEE 802.af employing TVWS band and IEEE 802.11ah employing a 900 MHz band. The main aim of these developments is beyond the expansion of a smart grid and a wide area sensor networks towards an extended range WiFi service.

When a selection of a wide band frequency is needed, an output impedance matching network may be designed by a selective matching based on a frequency bands, or a multi-level and multi-band power amplifier may be designed using switching devices and varactors. However, both the output impedance matching network and the multi-level and multi-band power amplifier use switching devices to change an output, a frequency band, etc., and therefore the output, impedance matching, etc. may be affected by the characteristics of the switching devices.

Generally, a method of selecting a frequency band includes a transmission line transformer (TLT) and capacitors or varactors disposed on both sides of the TLT. This method additionally needs a transistor which is a switching device. However, the switching device is a passive device and therefore not only generates additional power loss but also has poor linearity.

Another method of selecting a frequency band used previously is a method of properly tuning a length of a transmission line transformer which is an output impedance matching network. For impedance matching, as the method of tuning a length of a transmission line transformer, there are two methods such as a method of using switches, using a thin metal layer in a semiconductor process, etc. as described above. The main problems with the two methods are that efficiency of a power amplifier is reduced and sizes of a transmission line and a transformer are increased. Generally, the sizes of the transmission line and the transformer occupies the most space of an inside area of a power amplifier chip.

SUMMARY OF THE INVENTION

The present invention proposes a method of selecting a wide band frequency in a power amplifier so that the power amplifier has a high efficiency and gain without decreasing efficiency and gain when selecting a frequency band of the power amplifier.

Applying the present invention to an application requiring a wide band frequency, when common-gate bias conditions of a cascode stage are selected by changing a cell size of a power stage, characteristics of the desired frequency band can be obtained, therefore additional switches are not necessary, and accordingly efficiency and gain are not decreased.

When the technique of the present invention is used, the additional efficiency decrease of a power amplifier does not occur, and it is not necessary to increase sizes of a transmission line and a transformer. Therefore, in addition to the benefits of increased gain, increased output, and high efficiency of the power amplifier, the chip area of the power amplifier can be minimized resulting in an advantage of saving fabrication cost when manufacturing as a product.

According to an aspect of the present invention, there is provided a reconfigurable power amplifier capable of selecting a wide band frequency.

The reconfigurable power amplifier may include input transistors receiving a radio frequency (RF) signal, and a reconfigurable adaptive power cell configured to select the wide band frequency by applying a common-gate bias voltage to a plurality of common-gate transistors with a plurality of separate common gates to amplify the RF signal.

In an exemplary embodiment, the plurality of common-gate transistors may include a first common-gate transistor including a common gate having a first channel width and a second common-gate transistor including a common gate having a second channel width. The first channel width and the second channel width are different from each other.

Here, the common-gate bias voltage may include a first common-gate bias voltage applied to the common gate of the first common-gate transistor and a second common-gate bias voltage applied to the common gate of the second common-gate transistor. Further, the first common-gate bias voltage and the second common-gate bias voltage may be independent of each other.

Here, the number of the first common-gate transistors may be the same as the number of the second common-gate transistors. Further, the number of the first common-gate transistors may be different from the number of the second common-gate transistors.

In another exemplary embodiment, the common-gate bias voltage may include a first common-gate bias voltage applied to the common gate of the first common-gate transistor and a second common-gate bias voltage applied to the common gate of the second common-gate transistor. The first common-gate bias voltage and the second common-gate bias voltage may be independent of each other.

Here, the number of the first common-gate transistors may be the same as the number of the second common-gate transistors. Further, the numbers of the first common-gate transistor may be different from the numbers of the second common-gate transistor.

In still another exemplary embodiment, each of the plurality of common-gate transistors may include one of a complementary metal oxide semiconductor (CMOS) transistor, a gallium arsenide (GaAs) transistor, a hetero junction transistor (HBT), and a high electron mobility transistor (HEMT).

According to another aspect of the present invention, there is provided a reconfigurable power amplifier capable of selecting a wide band frequency.

The reconfigurable power amplifier may include a power stage configured to select the wide band frequency by applying a common-gate bias voltage to a plurality of common-gate transistors with a plurality of separate common gates to amplify the RF signal and a driver stage configured to amplify an input signal to generate the RF signal which can be amplified by the power stage.

In an exemplary embodiment, the driver stage may include a plurality of driver stages.

BRIEF DESCRIPTION OF THE DRAWINGS

Hereinafter, the present invention will be described referring to embodiments illustrated in attached drawings. To help understanding the present invention, throughout the entire diagrams attached, the same drawing symbols are assigned to the same elements. Configurations illustrated in the attached drawings are only embodiments implemented as examples to explain the present invention, and the scope of the present invention should not be limited to these.

DETAILED DESCRIPTION OF EXEMPLARY EMBODIMENTS

Figure 1:
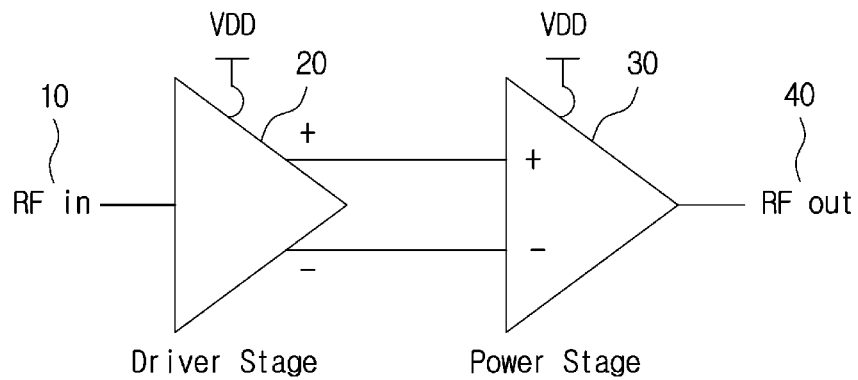
FIG. 1 is a diagram illustrating a two-stage reconfigurable power amplifier capable of selecting a wide band frequency.

While the present invention is susceptible to various modifications and alternative forms, specific embodiments thereof are shown by way of example in the drawings and will herein be described in detail. It should be understood, however, that there is no intent to limit the present invention to the particular forms disclosed, on the contrary, the present invention is to cover all modifications, equivalents, and alternatives falling within the spirit and scope of the present invention.

FIG. 1 is a diagram illustrating a two-stage reconfigurable power amplifier capable of selecting a wide band frequency.

Referring to FIG. 1, the two-stage reconfigurable power amplifier may include a driver stage 20 and a power stage 30. Here, the driver stage 20 may include a plurality of driver stages. When a radio frequency (RF) input signal 10 is input to the driver stage 20, the driver stage 20 amplifies the RF input signal and inputs the amplified signal to the power stage 30. The driver stage 20 may have high input impedance, low output impedance, and may amplify the RF input signal so that the RF input signal can be amplified by the power stage 30. The power stage 30 amplifies a signal output from the driver stage 20 to generate an RF output signal 40.

Figure 2:
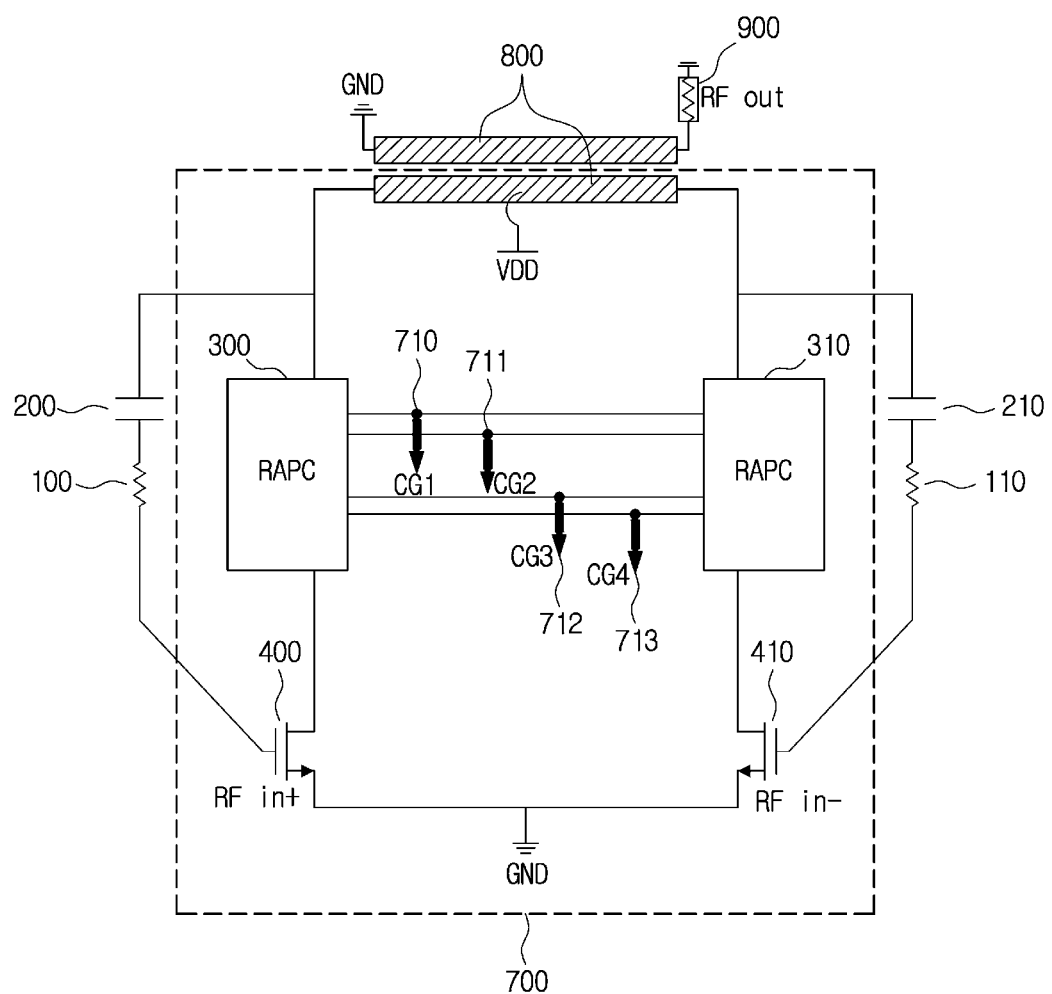
FIG. 2 is a diagram schematically illustrating a structure of a power stage of the reconfigurable power amplifier capable of selecting a wide band frequency shown in FIG. 1, which includes reconfigurable adaptive power cells.

FIG. 2 is a diagram schematically illustrating a structure of a power stage 30 of the reconfigurable power amplifier capable of selecting a wide band frequency shown in FIG. 1, which includes reconfigurable adaptive power cells (RAPC).

Referring to FIG. 2, a power stage 700 of the reconfigurable power amplifier capable of selecting a wide band frequency is a cascode power amplifier of a differential structure. The power stage 700 of the reconfigurable power amplifier may include reconfigurable adaptive power cells 300 and 310 having a common-gate structure, input transistors 400 and 410 receiving the RF input signal from RF In+ and RF In−, a transmission line transformer 800 for matching output impedance, negative feedback capacitors 200 and 210 and negative feedback resistors 100 and 110 disposed between an end of the transmission line transformer 800 and gates of the input transistors 400 and 410. The RF input signal input from the RF In+ and RF In− is amplified by the respective reconfigurable adaptive power cells 300 and 310 and is outputted to RF out 900. Here, when bias conditions of a bias applied to common gates of the reconfigurable adaptive power cells 300 and 310 are varied, power amplifier characteristics of a desired frequency band may be obtained. The common-gate bias voltages applied to the respective common gates may be a common-gate bias voltage1 (CG1) 710, a common-gate bias voltage2 (CG2) 711, a common-gate bias voltage3 (CG3) 712, and a common-gate bias voltage4 (CG4) 713.

Figure 3:
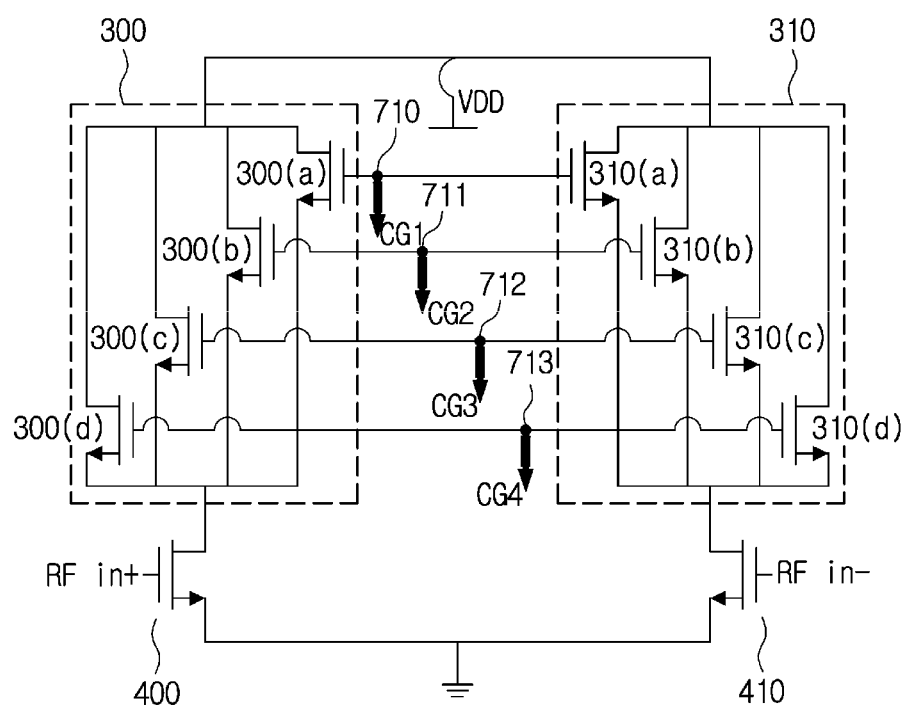
FIG. 3 is a diagram schematically illustrating a structure of the reconfigurable adaptive power cells shown in FIG. 2.

FIG. 3 is a diagram schematically illustrating a structure of the reconfigurable adaptive power cells 300 and 310 shown in FIG. 2.

Referring to FIG. 3, the reconfigurable adaptive power cells 300 and 310 are cascode stages of a differential structure. The reconfigurable adaptive power cell 300 which is a first cascode stage includes a plurality of common-gate transistors 300a, 300b, 300c, and 300d formed by a plurality of separate common gates, and the reconfigurable adaptive power cell 310 which is a second cascode stage includes a plurality of common-gate transistors 310a, 310b, 310c, and 310d formed by a plurality of separate common gates. The transistor 300a and the transistor 310a form a common-gate structure, the transistor 300b and the transistor 310b form the common-gate structure, the transistor 300c and the transistor 310c form the common-gate structure, and the transistor 300d and the transistor 310d form the common-gate structure. In FIG. 3, an example in which the reconfigurable adaptive power cells 300 and 310 each includes four common-gate transistors is illustrated, however, the number of common-gate transistors may be changed according to requirement specifications of communication systems to be applied.

Selection of a wide band frequency is possible by controlling biases applied to common-gate transistors formed by dividing common gates of cascode stages of a power amplifier. For this, the sizes of the common-gate transistors 300a, 300b, 300c, 300d, 310a, 310b, 310c, and 310d may be different. Further, the common-gate bias voltages (CG1) 710, (CG2) 711, (CG3) 712, and (CG4) 713 may be independently applied to the common-gate transistors 300a, 300b, 300c, 300d, 310a, 310b, 310c, and 310d. For example, the common-gate bias voltages (CG1) 710, (CG2) 711, (CG3) 712, and (CG4) 713 applied to the common-gate transistors 300a, 300b, 300c, 300d, 310a, 310b, 310c, and 310d may be different from one another. Further, for example, the common-gate bias voltages (CG1) 710, (CG2) 711, (CG3) 712, and (CG4) 713 may be sequentially turned on or off, or may be individually turned on or off.

Generally, a transistor having a gate channel length of 550 nm and a DC rated voltage applied to the transistor of 3.3 V may be used. However, a device having a gate channel length less than 550 nm and a supply voltage less than 3.3 V may be used for the common-gate transistors 300a, 300b, 300c, 300d, 310a, 310b, 310c, and 310d. For example, of the four common-gate transistors 300a, 300b, 300c, and 300d included in the reconfigurable adaptive power cell 300, two transistors may have a channel width of 4 mm and two remaining transistors may have a channel width of 0.9 mm. Similarly, of the four common-gate transistors 310a, 310b, 310c, and 310d included in the reconfigurable adaptive power cell 310, two transistors may have a channel width of 4 mm and two remaining transistors may have a channel width of 0.9 mm. As described above, by changing the channel width, selection of a wide band frequency is much easier, and characteristics of a desired frequency band may be obtained. Here, the common gate transistors may be a complementary metal oxide semiconductor (CMOS) transistor, a gallium arsenide (GaAs) transistor, a hetero junction transistor (HBT), etc.

Figure 4:
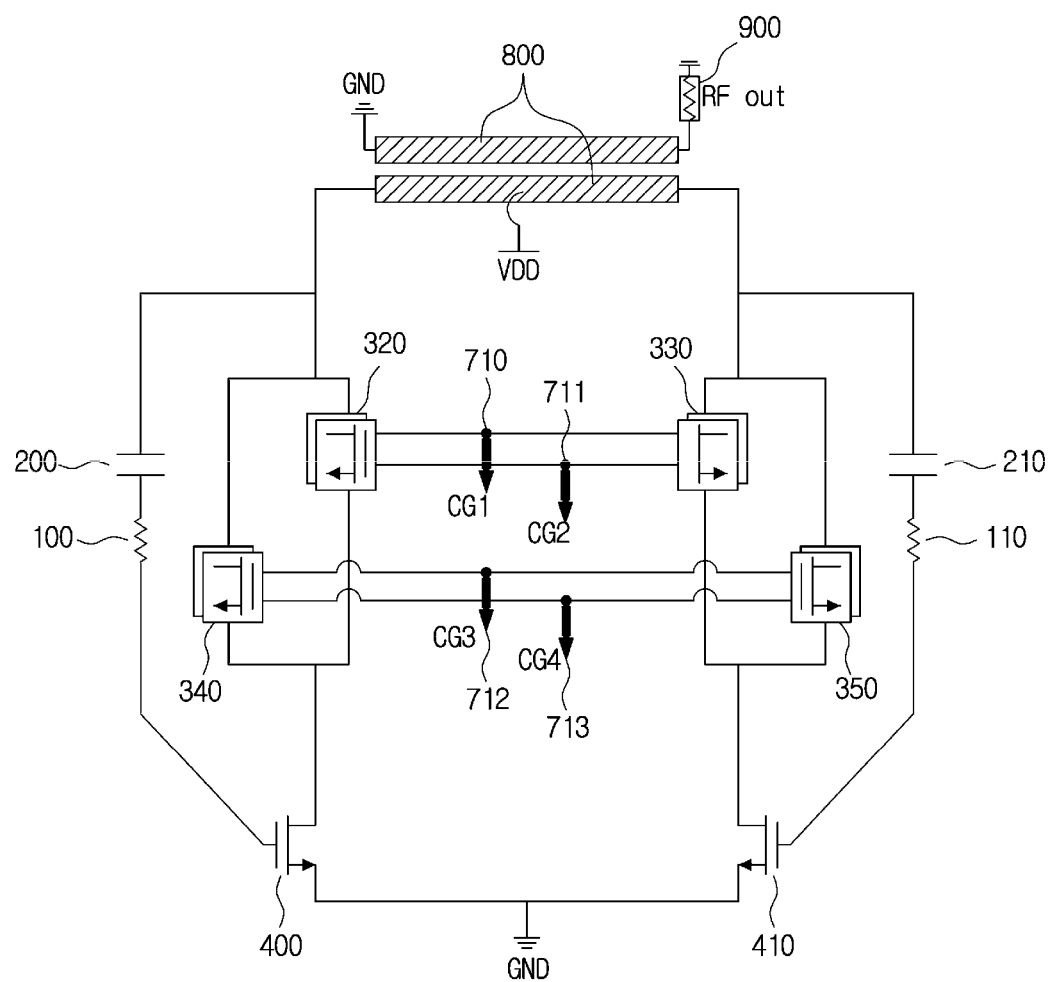
FIG. 4 is a diagram schematically illustrating the reconfigurable adaptive power cells shown in FIG. 3, which includes common-gate transistors divided into 4, in a first cell and a second cell.

FIG. 4 is a diagram schematically illustrating the reconfigurable adaptive power cells 300 and 310 shown in FIG. 3 which includes common-gate transistors divided into 4, in first cells 320 and 330 and second cells 340 and 350.

Referring to FIG. 4, the reconfigurable adaptive power cells 300 and 310 may include the first cells 320 and 330 having a first channel width and the second cells 340 and 350 having a second channel width. The first cell 320 may include two transistors, and the first cell 330 may also include two transistors. Each transistor of the first cell 320 may be connected to a corresponding transistor of the first cell 330 in the form of a common-gate structure. Similarly, the second cell 340 may include two transistors, and the second cell 350 may also include two transistors. Each transistor of the second cell 340 may be connected to a corresponding transistor of the second cell 350 in the form of a common-gate structure. The first channel width may be 4 mm, and the second channel width may be 0.9 mm. Here, the first channel width and the second channel width may have various values based on output powers and characteristics of transistors.

The common-gate bias voltages (CG1) 710, (CG2) 711, (CG3) 712, and (CG4) 713 may have different values from one another, and these voltages may be applied to the first cell 320 and 330 and the second cell 340 and 350, respectively. For example, when applied to a power amplifier which meets the IEEE 802.11ah standard, the common-gate bias voltages (CG1) 710, (CG2) 711, (CG3) 712, and (CG4) 713 may have 2.7 V, 2.5 V, 2.4 V, 2.2 V, respectively. The common-gate bias voltages applied to the common gate transistors may be changed to various values during the design based on application areas and characteristic requirements.

Hereinafter, operations of the reconfigurable adaptive power cells 300 and 310 will be described. Referring to FIG. 4, the reconfigurable adaptive power cells 300 and 310 may include a first cell 320 and 330 having a first channel width and a second cell 340 and 350 having a second channel width. Here, the first cell 320 and 330 may include a transistor having a first channel width of 4 mm, and the second cell 340 and 350 may include a transistor having a second channel width of 0.9 mm. For example, when the power amplifier operates with a maximum performance at a frequency band of 830 to 930 MHz, the first cell 320 and 330 of the reconfigurable adaptive power cells 300 and 310 may be turned off and the second cell 340 and 350 may be turned off. On the contrary, when the power amplifier operates with a maximum performance at a frequency band of 750 to 830 MHz, the first cell 320 and 330 of the reconfigurable adaptive power cells 300 and 310 and the second cell 340 and 350 are turned on. Therefore, when operation conditions of the reconfigurable adaptive power cells 300 and 310 are met, maximum output power, gain, linearity of a power amplifier may be maximally increased.

Figure 5:
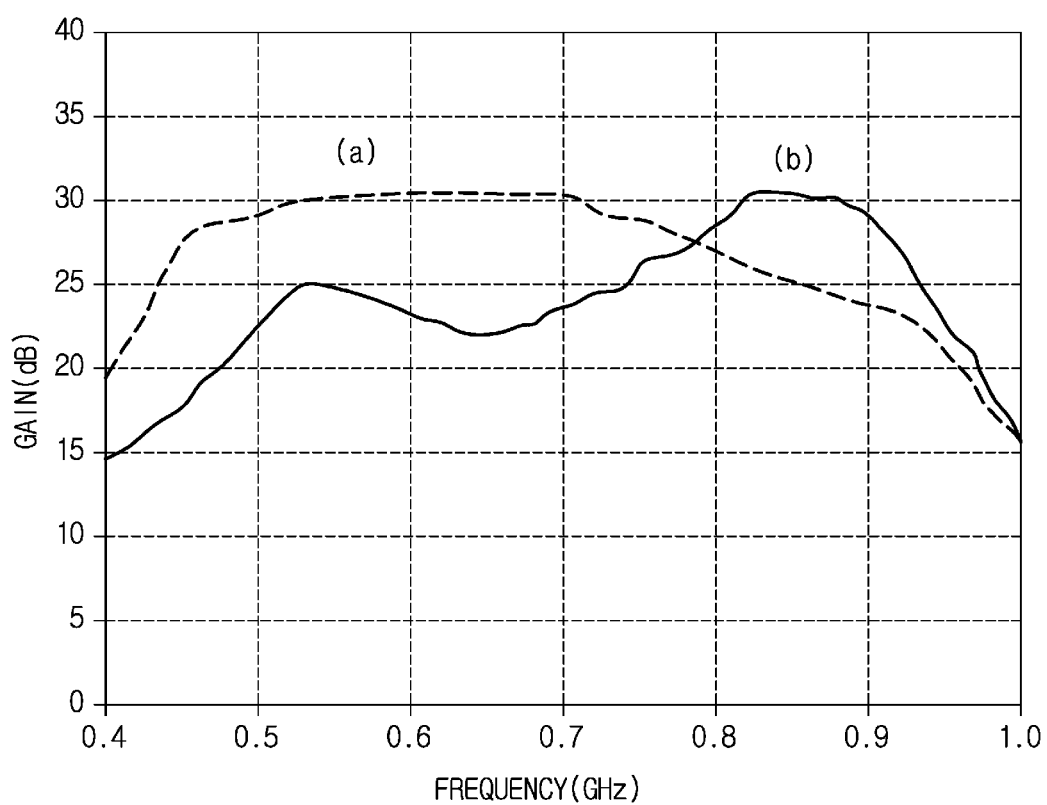
FIG. 5 is a graph illustrating a test result measured by a network analyzer which shows the possibility of frequency selection when the reconfigurable power amplifier is applied to wireless communication terminals and systems applied to a wide band frequency of IEEE 802.11ah.

FIG. 5 is a graph illustrating a test result measured by a network analyzer which shows the possibility of frequency selection when the reconfigurable power amplifier is applied to wireless communication terminals and systems to which a wide band frequency of IEEE 802.11ah is applied.

Referring to FIG. 5, it may be confirmed that the reconfigurable power amplifier is able to select a frequency band based on the operation of the reconfigurable adaptive power cells. The test was performed using the network analyzer and the output of the power amplifier was measured by a small signal S-parameter analyzing method. The graph of a test result represents values of gain S(2,1) (Gain) versus frequency. The graph (a) indicated by a dotted line is an S-parameter test result of the power amplifier when the power amplifier operates in a frequency band of 750 MHz to 800 MHz. The graph (b) indicated by a solid line is an S-parameter test result of the power amplifier when the power amplifier operates in a frequency band of 830 MHz to 930 MHz. Confirming the gain of individual countries in the graph, the gain of the United States frequency band of 902 MHz to 928 MHz, which is a frequency band prescribed by the IEEE 802.11ah standard, is 27 dB, the gain of the Korean frequency band of 917 MHz to 923.5 MHz is 26 dB, the gain at European frequency band of 863 MHz to 868.6 MHz is 30 dB, and the gain at Chinese frequency band of 779 MHz to 787 MHz is 27 dB.

Figure 6:
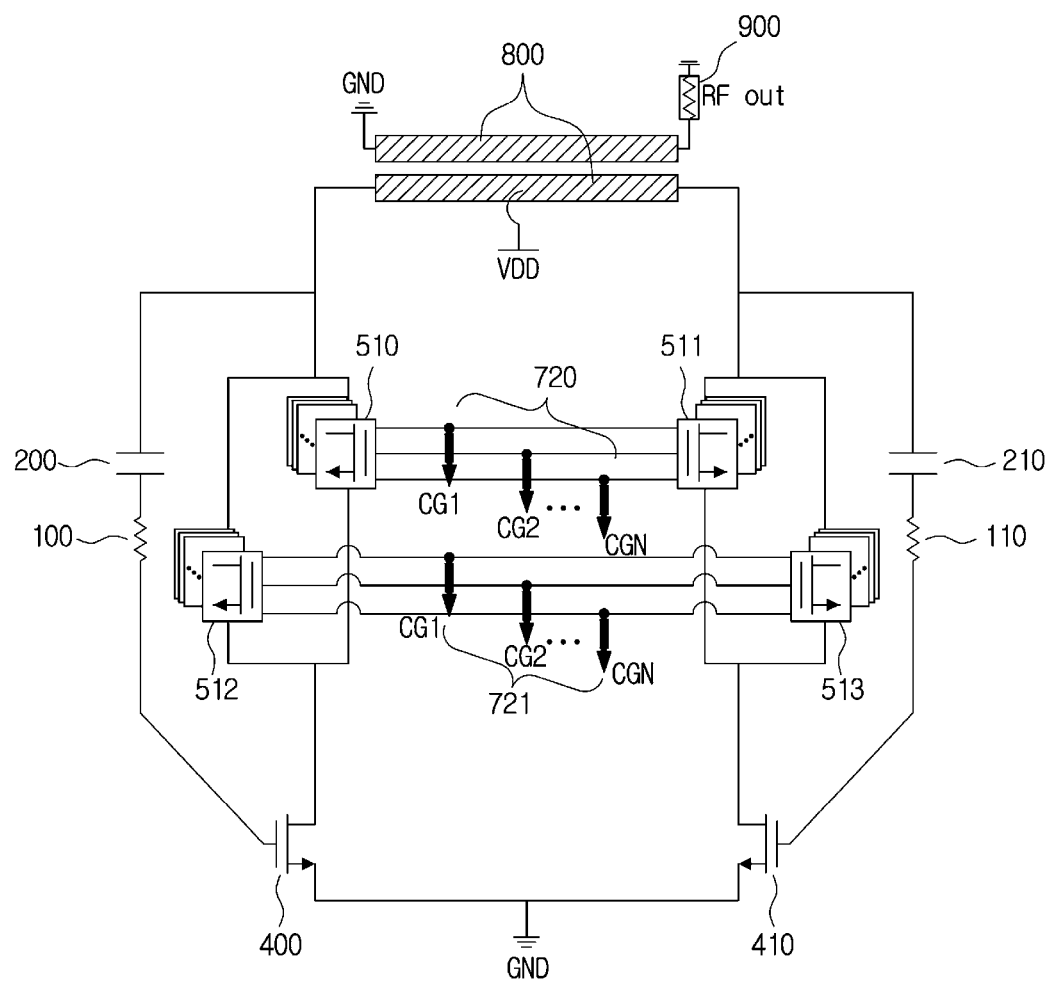
FIG. 6 is a diagram illustrating another structure of the reconfigurable adaptive power cells of the power amplifier.

FIG. 6 is a diagram illustrating another structure of the reconfigurable adaptive power cells of the power amplifier.

Referring to FIG. 6, when dividing common gates having the same channel length into channel widths, the number of channel width types may be two, and in each of first cells 510 and 511 and second cells 512 and 513, the common gates may be divided by N. In FIG. 4 described above, each reconfigurable adaptive power cell is divided into four common gates for which the number of types of channel width is two. For example, when the power amplifier is designed to be applied to another kind of system such as LTE or 802.11ac rather than 802.11ah, the channel widths of common gates have two types, which is the same as in the case of 802.11ah, however, the number of common gates may be the total of 6, 8, 10, . . . , N, etc. with respect to each reconfigurable adaptive power cell. Here, the common-gate bias voltages CG1 (720) to CGN (721) which are applied to the first cells 510 and 511 and the second cells 512 and 513 may be changed based on application areas of power amplifier and transistors used.

Figure 7:
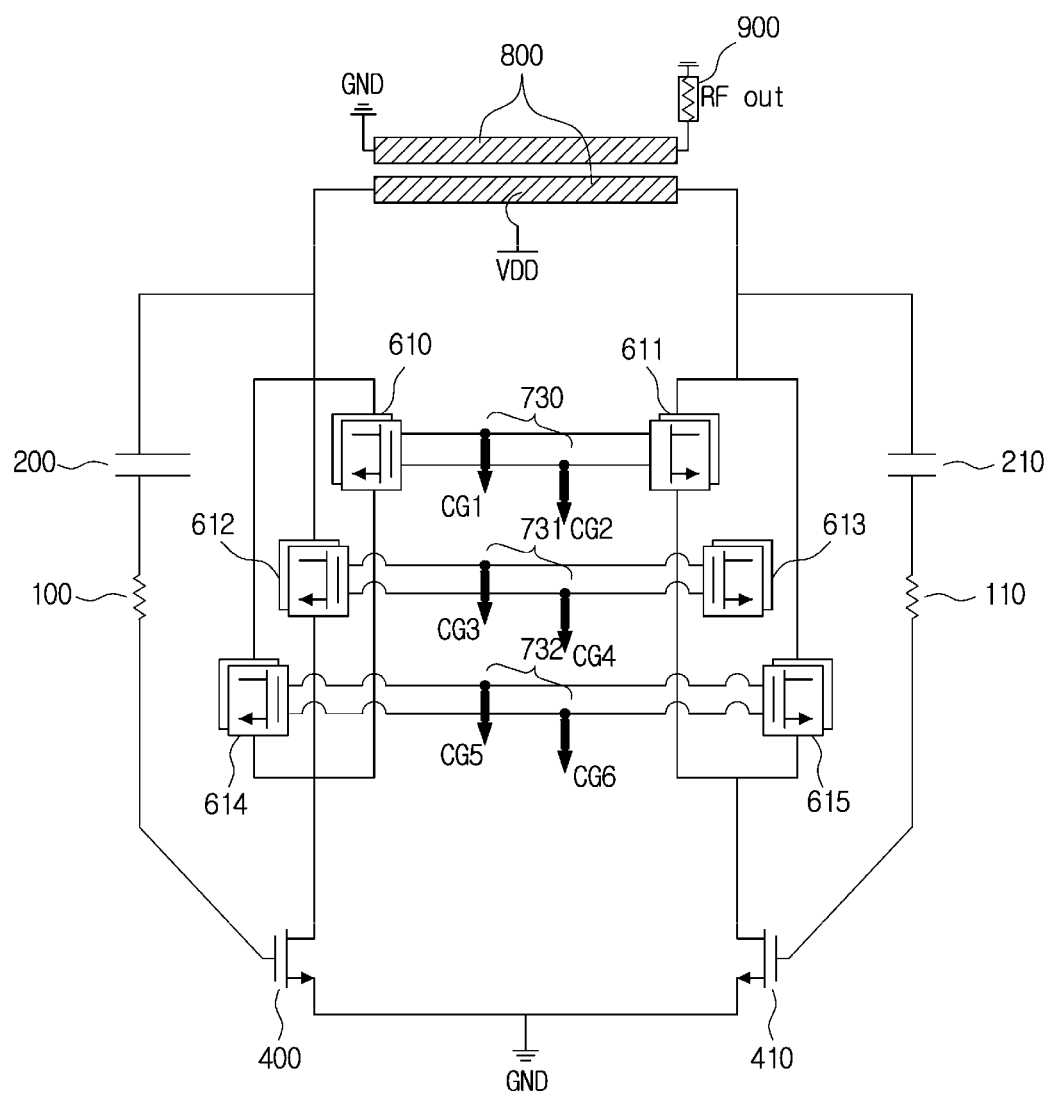
FIG. 7 is a diagram illustrating still another structure of the reconfigurable adaptive power cells of the power amplifier.

FIG. 7 is a diagram illustrating still another structure of the reconfigurable adaptive power cells of the power amplifier.

Referring to FIG. 7, when dividing common gates having the same channel length based on a channel width, kinds of channel widths may be three, and in each of first cells 610 and 611, second cells 612 and 613, and third cells 614 and 615, the common gates may be divided by two. The common-gate bias voltages CG1 to CG6 (730, 731, and 732), which are applied to the first cells 610 and 611, the second cells 612 and 613, and the third cells 614 and 615 may be changed based on application areas of a power amplifier and characteristics of transistors used.

Figure 8:
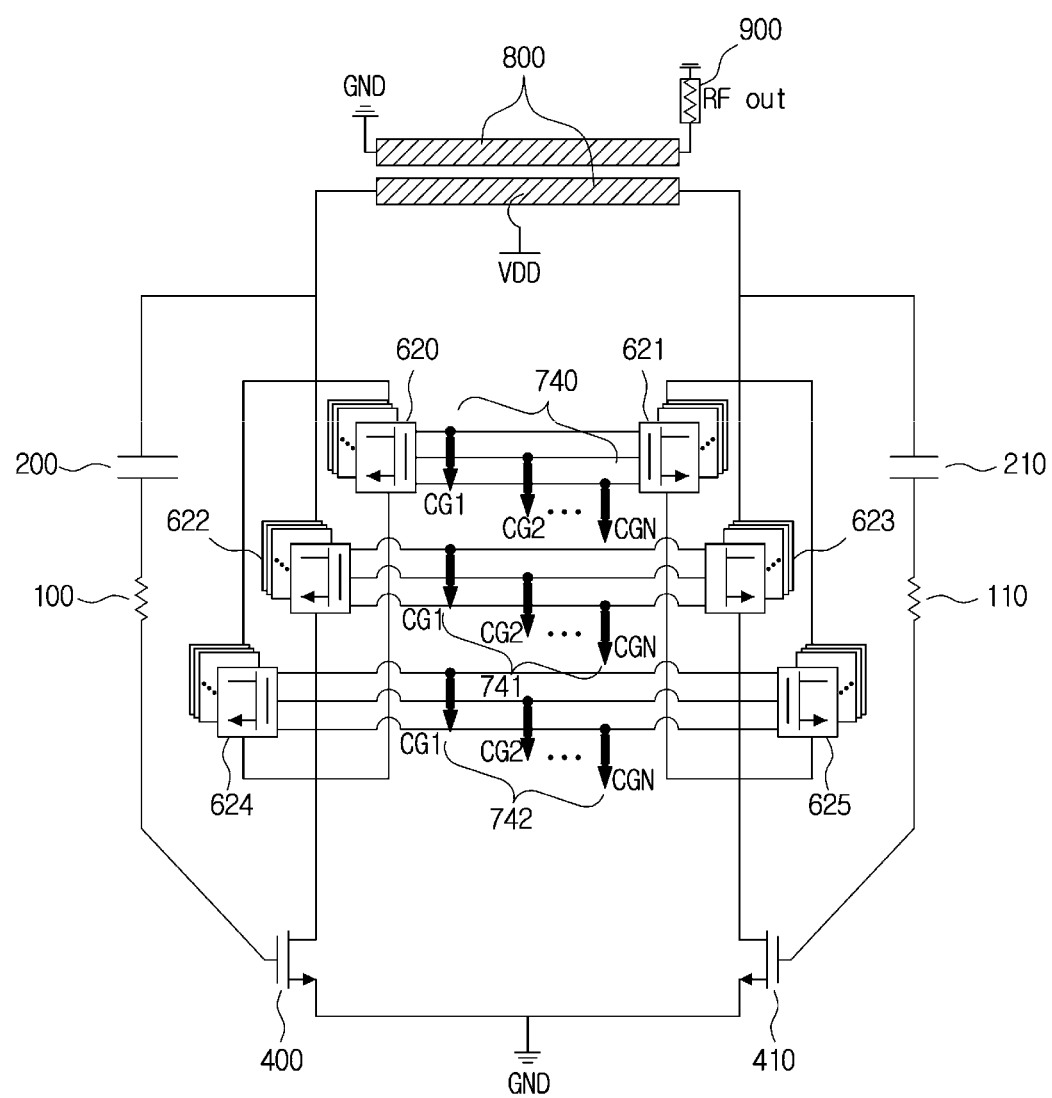
FIG. 8 is a diagram illustrating yet another structure of the reconfigurable adaptive power cells of the power amplifier.

FIG. 8 is a diagram illustrating yet another structure of the reconfigurable adaptive power cells of the power amplifier.

When dividing common gates having the same channel length based on a channel width, the number of types of channel widths may be M, and in each of a first cell to the Mth cell, the common gates may be divided by N. Therefore, the number of common-gate transistors included in one pair of reconfigurable adaptive power cells is 2*M*N. Referring to FIG. 8, the reconfigurable adaptive power cells may include first cells 620 and 621 having a first channel width, second cells 622 and 623 having a second channel width, and third cells 624 and 625 having a third channel width. Each of the first cells 620 and 621, the second cells 622 and 623, and the third cells 624 and 625 may include N common gate transistors. When designing reconfigurable adaptive power cells, the channel widths of common gates may be designed to have three types to obtain a desired output in a power amplifier. Further, when dividing common gates in a device having the same channel width according to application areas, the common gates may be designed so that the common gates are divided by not only two but also 4, 6, 8, . . . , n (620, 621, 622, 623, 624, and 625). The common-gate bias voltages CG1 to CGN (740, 741, and 742) applied to the first cells 620 and 621, the second cells 622 and 623, and the third cells 624 and 625 may be changed based on application areas of a power amplifier and characteristics of transistors used.

Figure 9:
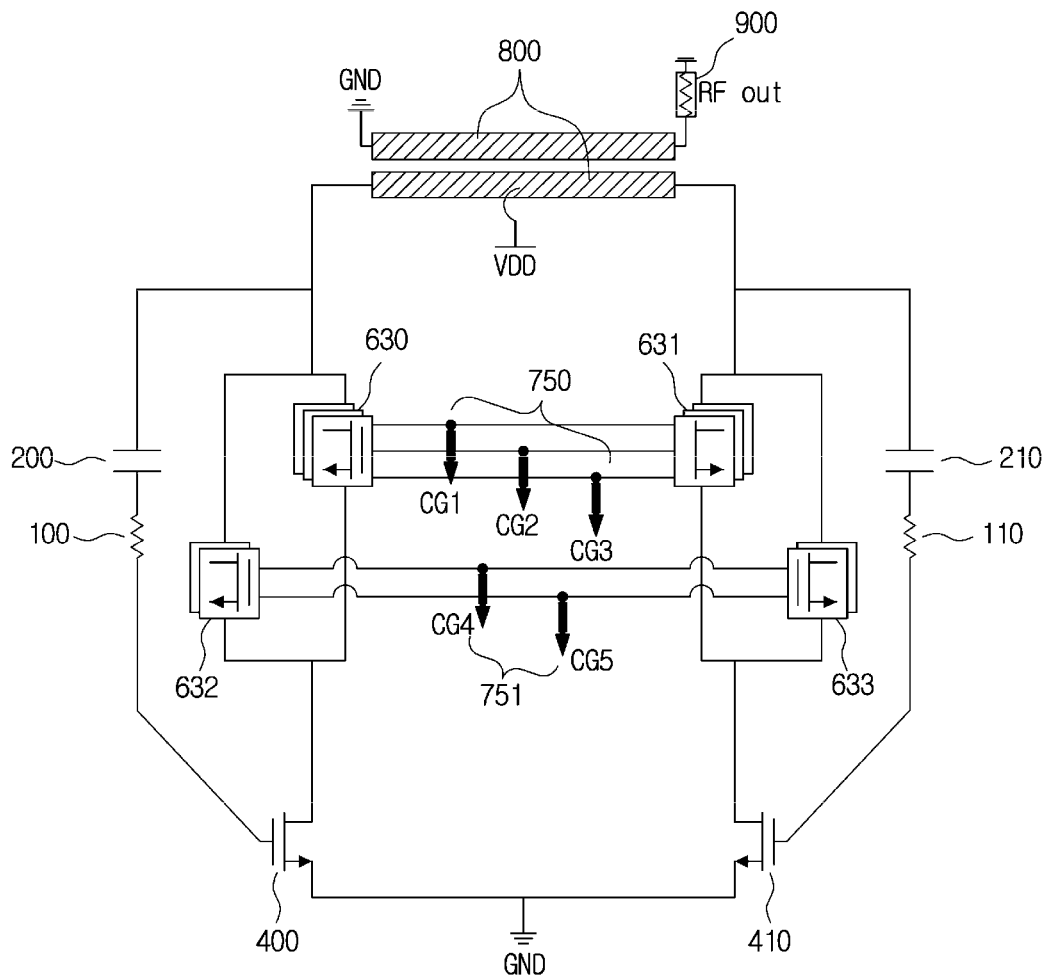
FIG. 9 is a diagram illustrating yet another structure of the reconfigurable adaptive power cells of the power amplifier.

FIG. 9 is a diagram illustrating yet another structure of the reconfigurable adaptive power cells of the power amplifier.

When dividing common gates having the same channel length based on a channel width, the number of types of channel widths may be M, and the divided common gates may be different from one another from first cell to the Mth cell. Referring to FIG. 9, the reconfigurable adaptive power cells may include first cells 630 and 631 having a first channel width, and second cells 632 and 633 having a second channel width. Each of the first cells 630 and 631 has three common-gate transistors, and each of the second cells 632 and 633 has two common-gate transistors. Therefore, the number of common-gate transistors included in one pair of reconfigurable adaptive power cells is ten. That is, when the channel widths are different from one another, the division of the common gates may be different for different channel widths. The common-gate bias voltages CG1 to CG5 (750 and 751) applied to the first cells 630 and 631 and the second cells 632 and 633 may be changed based on application areas of a power amplifier and characteristics of transistors used.

Figure 10:
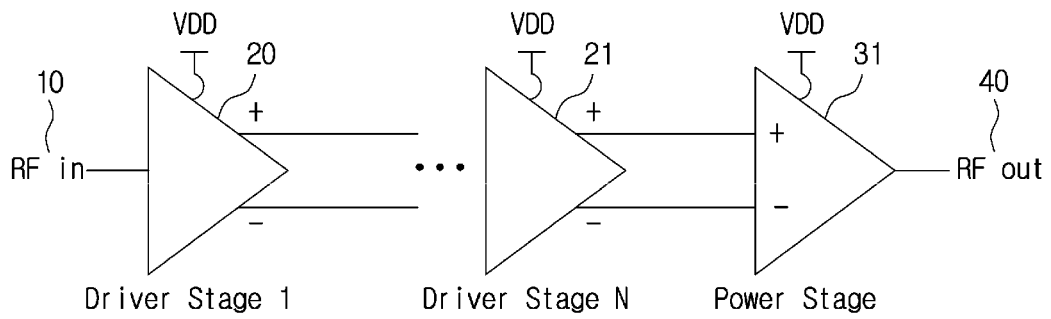
FIG. 10 is a diagram illustrating a multi-staged reconfigurable power amplifier capable of selecting a wide band frequency.

FIG. 10 is a diagram illustrating a multi-stage reconfigurable power amplifier capable of selecting a wide band frequency.

Referring to FIG. 10, the reconfigurable power amplifier may include N driver stages 20 and 21, and a power stage 31. Here, the reconfigurable adaptive power cells in which common gates are divided may be only applied to the power stage 31 so that the reconfigurable power amplifier capable of selecting a wide band frequency is implemented. Compared to a structure of the two-stage reconfigurable power amplifier of FIG. 1, a plurality of driver stages may be required to obtain a gain and an output power required depending on application areas.

The reason that the reconfigurable adaptive power cells in which common gates are divided are only applied to the power stage 31 is that 3 dB frequency bandwidth of an output transmission line transformer is much wider compared to an inter-stage transformer (inter-stage TLT), and therefore performing an output impedance matching due to a frequency bandwidth selection is easy. Further, when the reconfigurable adaptive power cells in which common gates are divided are simultaneously applied to the driver stages 20 and 21 and the power stage 31, the size of the reconfigurable power amplifier may become large. Therefore, the selection of a wide band frequency may be possible even when a common-gate division method is only applied to the power stage 31.

Ultimately, the power amplifier may be designed as 1-stage to N-stage based on necessary application areas such as wireless communication terminals and systems and frequencies, and the design of the power amplifier may be different based on the criteria of a gain, an output, efficiency, etc. In the power amplifier, when the power stage which is the last stage is composed of the reconfigurable adaptive power cells in which common gates are divided corresponding to those shown in FIGS. 4, 6, 7, 8, and 9, the reconfigurable power amplifier capable of selecting a wide band frequency may be implemented.

According to the present invention, a reconfigurable power amplifier capable of selecting a wide band frequency used in a wireless communication of a radio frequency (RF) and a microwave band is provided. When a technique of the present invention is applied to a power amplifier and a band of a wide band frequency is selected, a desired frequency band selection may be possible even without additional passive elements, e.g., a switch element, etc. The passive element has a resistive component, and therefore may decrease efficiency which is the most important performance index of the power amplifier. Because the passive elements are not included, the power amplifier may be designed to have a high efficiency and high gain characteristics.

Meanwhile, the additional efficiency decrease of a power amplifier does not occur, and it is not necessary to increase the sizes of a transmission line and a transformer. Therefore, in addition to the benefits of increased gain, increased output, and high efficiency of the power amplifier, the chip area of the power amplifier can be minimized resulting in an advantage of saving fabrication cost when manufacturing as a product.

Further, when a technique of the present invention is applied, designing of IEEE 802.11ah wide band WiFi wireless terminals and wireless communication systems may be possible using the same wide band power amplifier in all the countries which use a standard of IEEE 802.11ah. Therefore, when designing wide band WiFi wireless terminals and wireless communication systems, cost may be reduced. Furthermore, the whole wide band WiFi module design may be simplified.

When a technique of the present invention is applied, implementation of a power amplifier satisfying an entire range of very broad frequency band is possible by changing only a part of common-gate bias conditions of a cascode stage. Further, the technique of the present invention may be applied not only to this but also to application areas using various frequency bands, i.e. WCDMA, 4G, LTE, and power amplifiers of wireless communication terminals and wireless communication systems of the future.

Although a few embodiments have been described with reference to the accompanying drawings, those skilled in the art will readily appreciate that many modifications are possible in embodiments without departing from the scope of the present invention and without changing essential features. Therefore, the above-described embodiments should be understood in a descriptive sense only and not for purposes of limitation.

The scope of the present invention are defined in the claims described below rather than the detailed description, and all the modifications and transformed forms derived from the meaning and scope of the claims and equivalent concepts thereof should be construed as included within the scope of the appended claims.

What is claimed is:

1. A reconfigurable power amplifier capable of selecting a wide band frequency, the reconfigurable power amplifier comprising:
   first and second input transistors configured to receive a radio frequency (RF) signal; and
   a reconfigurable adaptive power stage including a first reconfigurable adaptive power cell (RAPC) and a second RAPC,
      wherein the first RAPC comprises first and second transistors having respective first conduction terminals connected to the first input transistor and respective second conduction terminals connected to a first output,
      wherein the second RAPC comprises third and fourth transistors having respective first conduction terminals connected to the second input transistor and respective second conduction terminals connected to a second output,
      wherein respective gates of the first and third transistors are connected to a first common-gate bias voltage, and
      wherein respective gates of the second and fourth transistors are connected to a second common-gate bias voltage,
   wherein the reconfigurable adaptive power stage is configured to select the wide band frequency using one or more of the first and second common-gate bias voltages and to amplify the RF signal.

2. The reconfigurable power amplifier of claim 1,
   wherein the first transistor has a first channel width,
   wherein the second transistor has a second channel width,
   wherein the third transistor has a channel width substantially the same as the first channel width,
   wherein the fourth transistor has a channel width substantially the same as the second channel width, and
   wherein the first channel width and the second channel width are substantially different from each other.

3. The reconfigurable power amplifier of claim 1, wherein the first common-gate bias voltage and the second common-gate bias voltage are independent of each other.

4. The reconfigurable power amplifier of claim 2, wherein a number of transistors in the first and second RAPCs having the first channel width is the same as a number of transistors in the first and second RAPCs having the second channel width.

5. The reconfigurable power amplifier of claim 2, wherein a number of transistors in the first and second RAPCs having the first channel width is different from a number of transistors in the first and second RAPCs having the second channel width.

6. The reconfigurable power amplifier of claim 1, wherein each of the first to fourth transistors includes one of a complementary metal oxide semiconductor (CMOS) transistor, a gallium arsenide (GaAs) transistor, a hetero junction transistor (HBT), and a high electron mobility transistor (HEMT).

7. A reconfigurable power amplifier capable of selecting a wide band frequency, comprising:
   a power stage comprising a first reconfigurable adaptive power cell (RAPC) and a second RAPC, and configured to select the wide band frequency using first and second common-gate bias voltage and to amplify the RF signal; and
   a driver stage configured to amplify an input signal to generate the RF signal which can be amplified by the power stage,
   wherein the first RAPC comprises first and second transistors having respective first conduction terminals coupled to a first output of the driver stage and respective second conduction terminals connected to a first output of the power stage,
   wherein the second RAPC comprises third and fourth transistors having respective first conduction terminals coupled to a second output of the driver stage and respective second conduction terminals connected to a second output of the power stage,
   wherein respective gates of the first and third transistors are connected to the first common-gate bias voltage, and
   wherein respective gates of the second and fourth transistors are connected to the second common-gate bias voltage.

8. The reconfigurable power amplifier of claim 7,
   wherein the first and third transistors each have a first channel width; and
   wherein the second and fourth transistors have a second channel width, and
   wherein the first channel width and the second channel width are different from each other.

9. The reconfigurable power amplifier of claim 7, wherein the first common-gate bias voltage and the second common-gate bias voltage are independent of each other.

10. The reconfigurable power amplifier of claim 8, wherein a number of transistors in the first and second RAPCs having the first channel width is the same as a number of transistors in the first and second RAPCs having the second channel width.

11. The reconfigurable power amplifier of claim 8, wherein a number of transistors in the first and second RAPCs having the first channel width is different from a number of transistors in the first and second RAPCs having the second channel width.

12. The reconfigurable power amplifier of claim 7, wherein the driver stage includes a plurality of driver stages.

13. The reconfigurable power amplifier of claim 7, wherein each of the first and second RAPCs is configured to operate as a cascade stage.

14. The reconfigurable power amplifier of claim 1, wherein each of the first and second RAPCs is configured to operate as a cascade stage.

\* \* \* \* \*